(12) United States Patent
Hsu et al.

(10) Patent No.: US 11,961,897 B2
(45) Date of Patent: Apr. 16, 2024

(54) NEGATIVE CAPACITANCE TRANSISTOR WITH EXTERNAL FERROELECTRIC STRUCTURE

(71) Applicant: Taiwan Semiconductor Manufacturing Co., Ltd., Hsin-Chu (TW)

(72) Inventors: Chi-Hsing Hsu, New Taipei (TW); Sai-Hooi Yeong, Zhubei (TW); Ching-Wei Tsai, Hsinchu (TW); Kuan-Lun Cheng, Hsin-Chu (TW); Chih-Hao Wang, Baoshan Township (TW); Min Cao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 150 days.

(21) Appl. No.: 17/572,267

(22) Filed: Jan. 10, 2022

(65) Prior Publication Data

US 2022/0130976 A1    Apr. 28, 2022

Related U.S. Application Data

(62) Division of application No. 16/572,341, filed on Sep. 16, 2019, now Pat. No. 11,222,958.

(Continued)

(51) Int. Cl.
*H01L 29/51* (2006.01)
*H01L 21/02* (2006.01)
(Continued)

(52) U.S. Cl.
CPC ...... *H01L 29/516* (2013.01); *H01L 21/02178* (2013.01); *H01L 21/02181* (2013.01);
(Continued)

(58) Field of Classification Search
CPC . H01L 29/516; H01L 29/517; H01L 29/0653; H01L 27/0924; H01L 21/02178;
(Continued)

(56) References Cited

U.S. PATENT DOCUMENTS 7,667,271 B2   2/2010   Yu et al.
8,362,575 B2   1/2013   Kwok et al.
(Continued)

OTHER PUBLICATIONS

Müller, Johannes et al., "Ferroelectricity in Simple Binary ZrO2 and HfO2," dx.doi.org, 10.1021, nl302049k, Nano Lett., 2012, 12, pp. 4318-4323, ACS Publications.

*Primary Examiner* — Shaun M Campbell
(74) *Attorney, Agent, or Firm* — HAYNES AND BOONE, LLP

(57) ABSTRACT

A first fin structure is disposed over a substrate. The first fin structure contains a semiconductor material. A gate dielectric layer is disposed over upper and side surfaces of the first fin structure. A gate electrode layer is formed over the gate dielectric layer. A second fin structure is disposed over the substrate. The second fin structure is physically separated from the first fin structure and contains a ferroelectric material. The second fin structure is electrically coupled to the gate electrode layer.

20 Claims, 18 Drawing Sheets

Related U.S. Application Data

(60) Provisional application No. 62/738,657, filed on Sep. 28, 2018.

(51) Int. Cl.
*H01L 21/8238* (2006.01)
*H01L 27/092* (2006.01)
*H01L 29/06* (2006.01)

(52) U.S. Cl.
CPC .. *H01L 21/02186* (2013.01); *H01L 21/02189* (2013.01); *H01L 21/02194* (2013.01); *H01L 21/823821* (2013.01); *H01L 21/823857* (2013.01); *H01L 21/823878* (2013.01); *H01L 27/0924* (2013.01); *H01L 29/0653* (2013.01); *H01L 29/517* (2013.01)

(58) Field of Classification Search
CPC ......... H01L 21/02181; H01L 21/02189; H01L 21/02194; H01L 21/823821; H01L 21/823857; H01L 21/823878
See application file for complete search history.

(56) References Cited

U.S. PATENT DOCUMENTS

| | | | |
|---|---|---|---|
| 8,367,498 B2 | 2/2013 | Chang et al. | |
| 8,440,517 B2 | 5/2013 | Lin et al. | |
| 8,497,528 B2 | 7/2013 | Lee et al. | |
| 8,520,482 B2 | 8/2013 | Mahnad et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,772,109 B2 | 7/2014 | Colinge | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,711,533 B2 | 7/2017 | Ching et al. | |
| 9,978,868 B2 | 5/2018 | Lai et al. | |
| 10,861,973 B2 | 12/2020 | Hsu et al. | |
| 2003/0235067 A1 | 12/2003 | Sakai et al. | |
| 2004/0211998 A1* | 10/2004 | Araujo | H01L 21/02271 257/295 |
| 2011/0068407 A1 | 3/2011 | Yeh et al. | |
| 2013/0011983 A1 | 1/2013 | Tsai et al. | |
| 2013/0270620 A1 | 10/2013 | Hu et al. | |
| 2014/0252412 A1 | 9/2014 | Tsai et al. | |
| 2015/0060969 A1 | 5/2015 | Matsuura | |
| 2016/0005749 A1* | 1/2016 | Li | H10B 41/30 257/295 |
| 2016/0358915 A1* | 12/2016 | Flachowsky | H01L 29/518 |
| 2017/0110476 A1* | 4/2017 | Ching | H01L 27/11807 |
| 2017/0141235 A1 | 5/2017 | Lai et al. | |
| 2017/0221769 A1* | 8/2017 | Park | H01L 21/823481 |
| 2018/0151745 A1 | 5/2018 | Chang et al. | |
| 2018/0182860 A1 | 6/2018 | Lee et al. | |
| 2018/0374964 A1* | 12/2018 | Wang | H01L 29/66181 |
| 2020/0243687 A1 | 7/2020 | Ota et al. | |

* cited by examiner

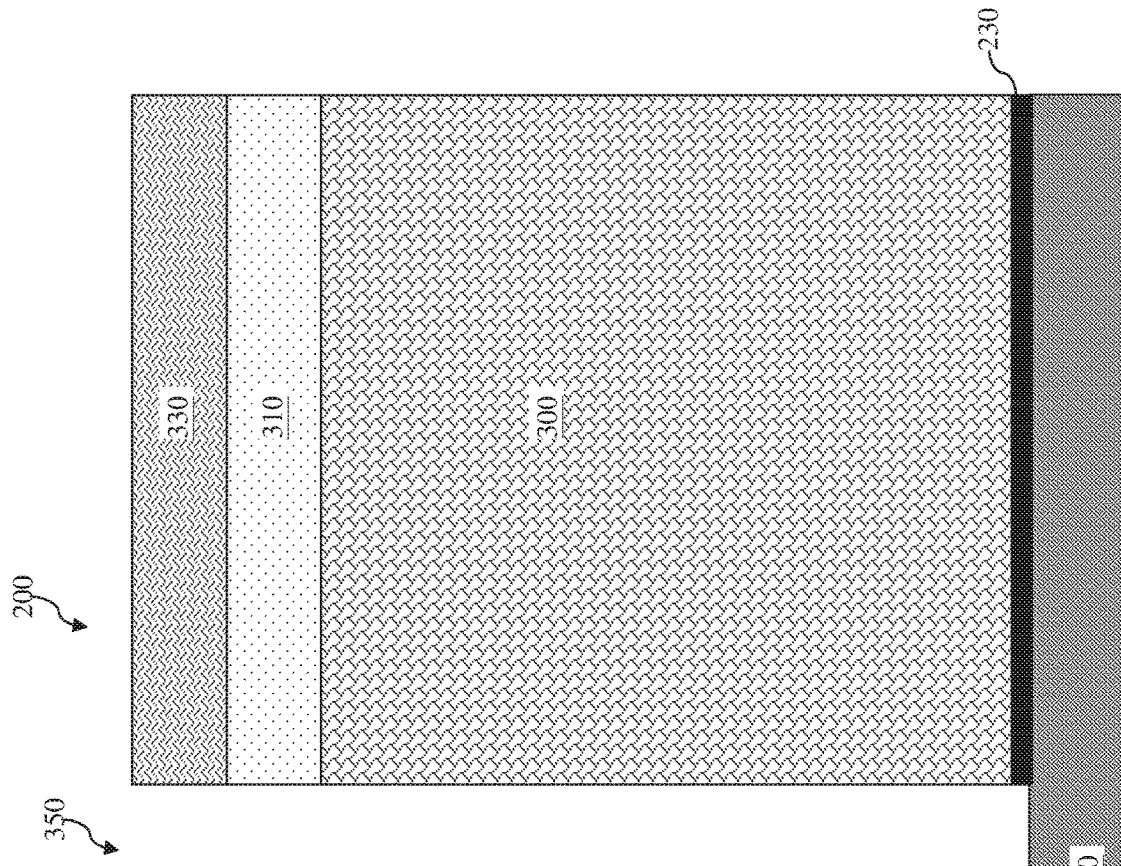
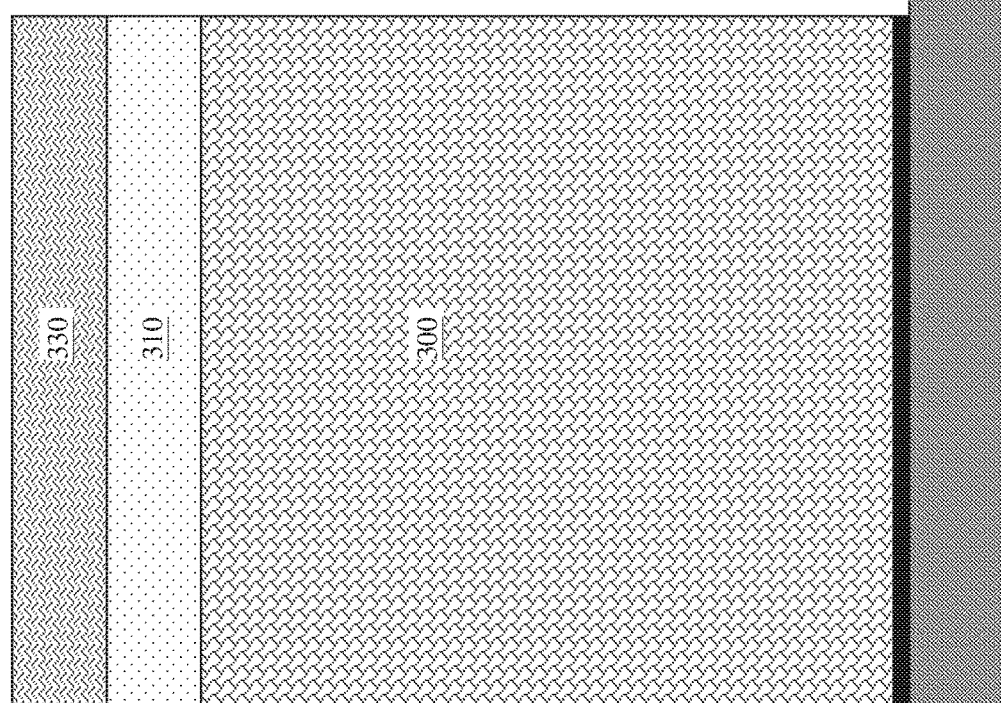
Fig. 4B

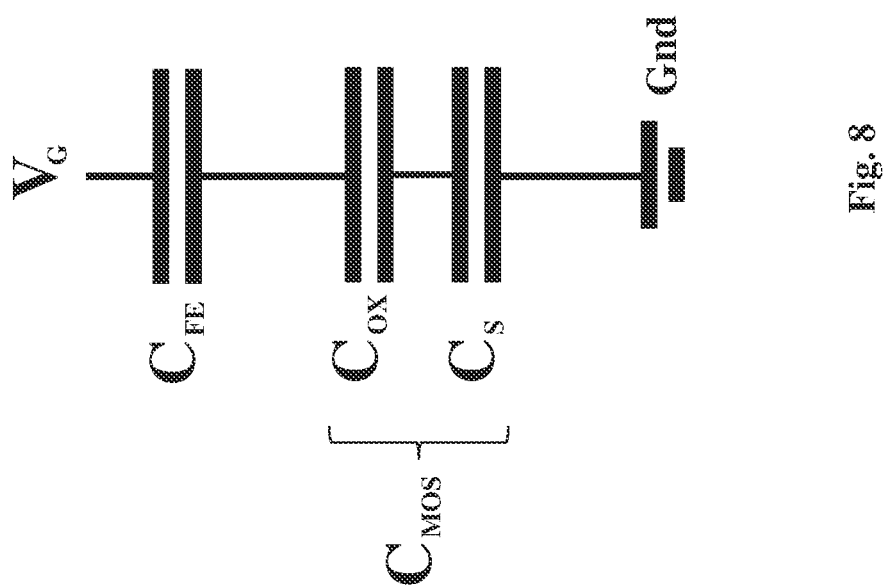

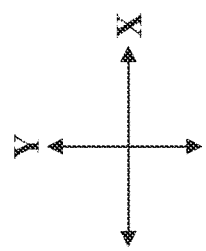
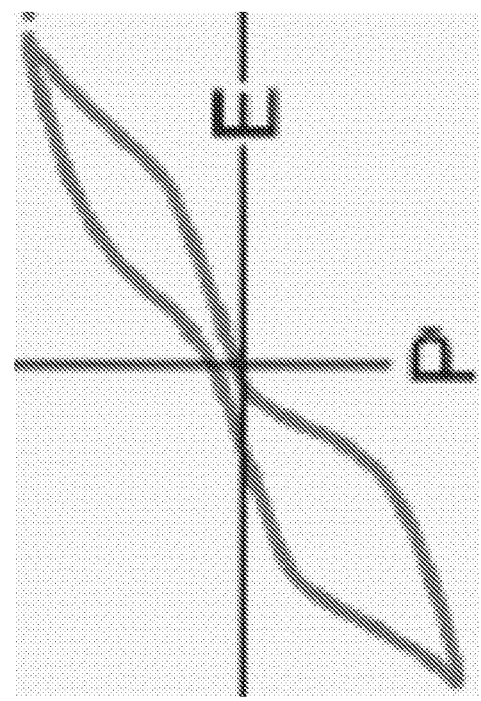
Fig. 9A
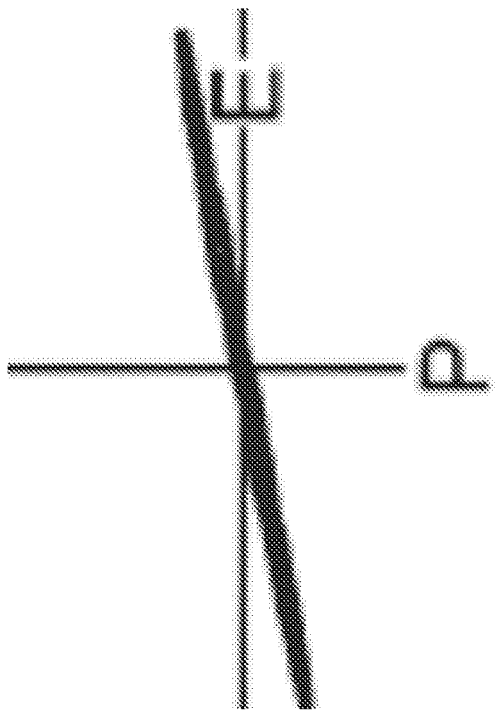
Fig. 9B
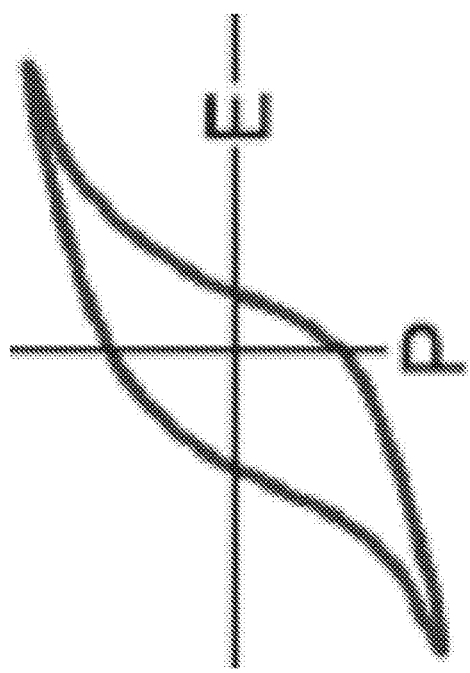
Fig. 9C

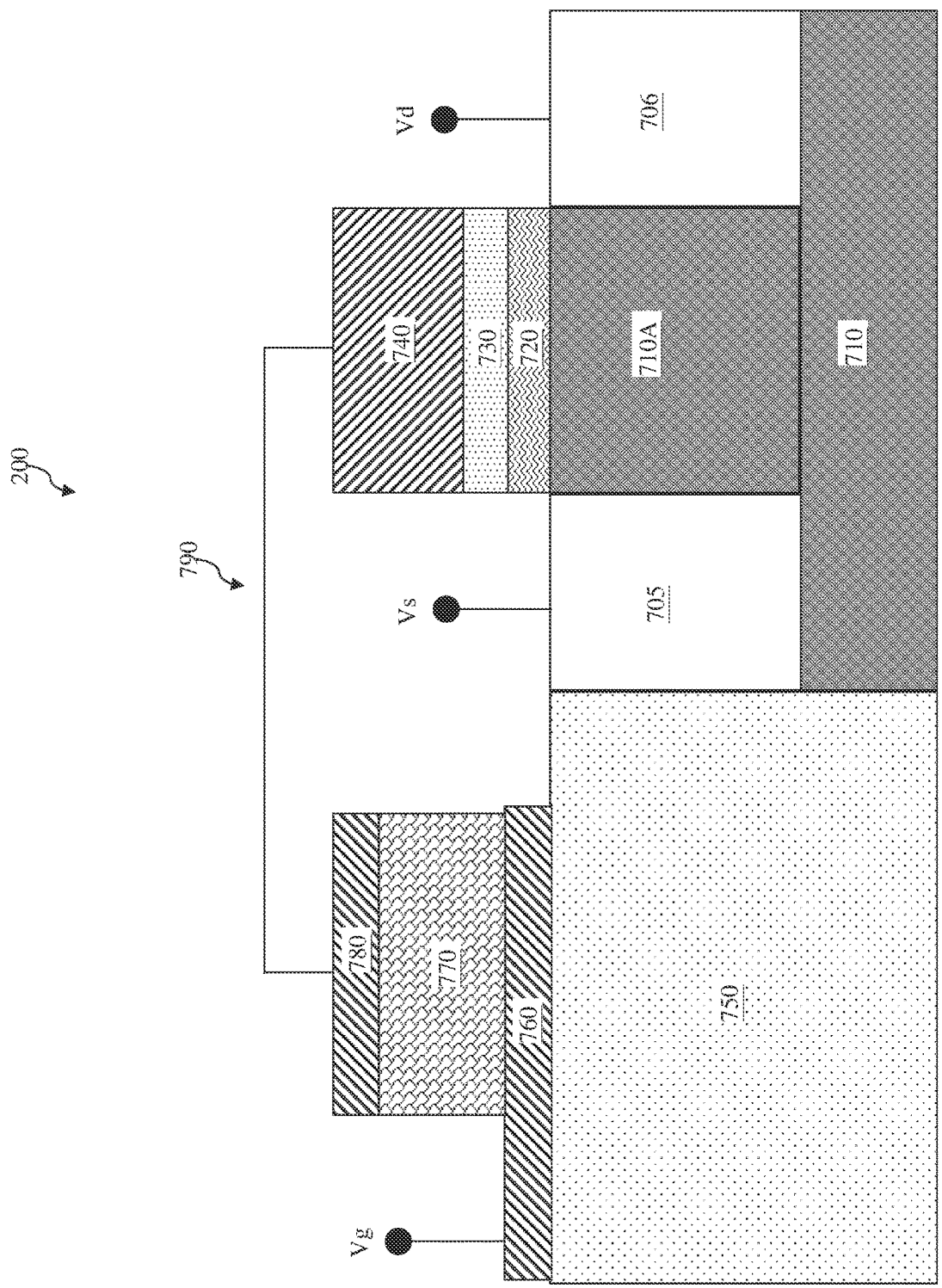

NEGATIVE CAPACITANCE TRANSISTOR WITH EXTERNAL FERROELECTRIC STRUCTURE

PRIORITY DATA

This application is a divisional U.S. Patent Application of U.S. patent application Ser. No. 16/572,341, filed on Sep. 16, 2019, entitled "Negative Capacitance Transistor with External Ferroelectric Layer", issued as U.S. Pat. No. 11,222,958, which claims priority to U.S. Provisional Patent Application Ser. No. 62/738,657 entitled "Negative Capacitance Transistor with External Ferroelectric Layer" and filed on Sep. 28, 2018, the entire disclosures of each which is incorporated herein by reference. This application is also related to U.S. patent application Ser. No. 16/284,871, entitled "Negative Capacitance Transistor With a Diffusion Blocking Layer" and filed on Feb. 25, 2019, the entire disclosure of which is incorporated herein by reference.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor. Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. To improve performance, negative capacitance transistors may be created by forming a gate dielectric having a ferroelectric material. However, existing methods and devices for forming negative capacitance devices may still need improvements, for example with respect to the flexibility of configuring the size and/or location of the ferroelectric material.

Therefore, although existing methods of fabricating negative capacitance devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-7A are cross-sectional views of an example semiconductor device in accordance with some embodiments.

FIGS. 2B-7B are cross-sectional views of an example semiconductor device in accordance with some embodiments.

FIG. 8 is a capacitance model of a semiconductor device in accordance with some embodiments.

FIGS. 9A, 9B, and 9C illustrate remanent polarization versus coercive field plots of various materials.

FIG. 10 is a cross-sectional view of an example semiconductor device in accordance with some embodiments.

DETAILED DESCRIPTION

Figure 1:
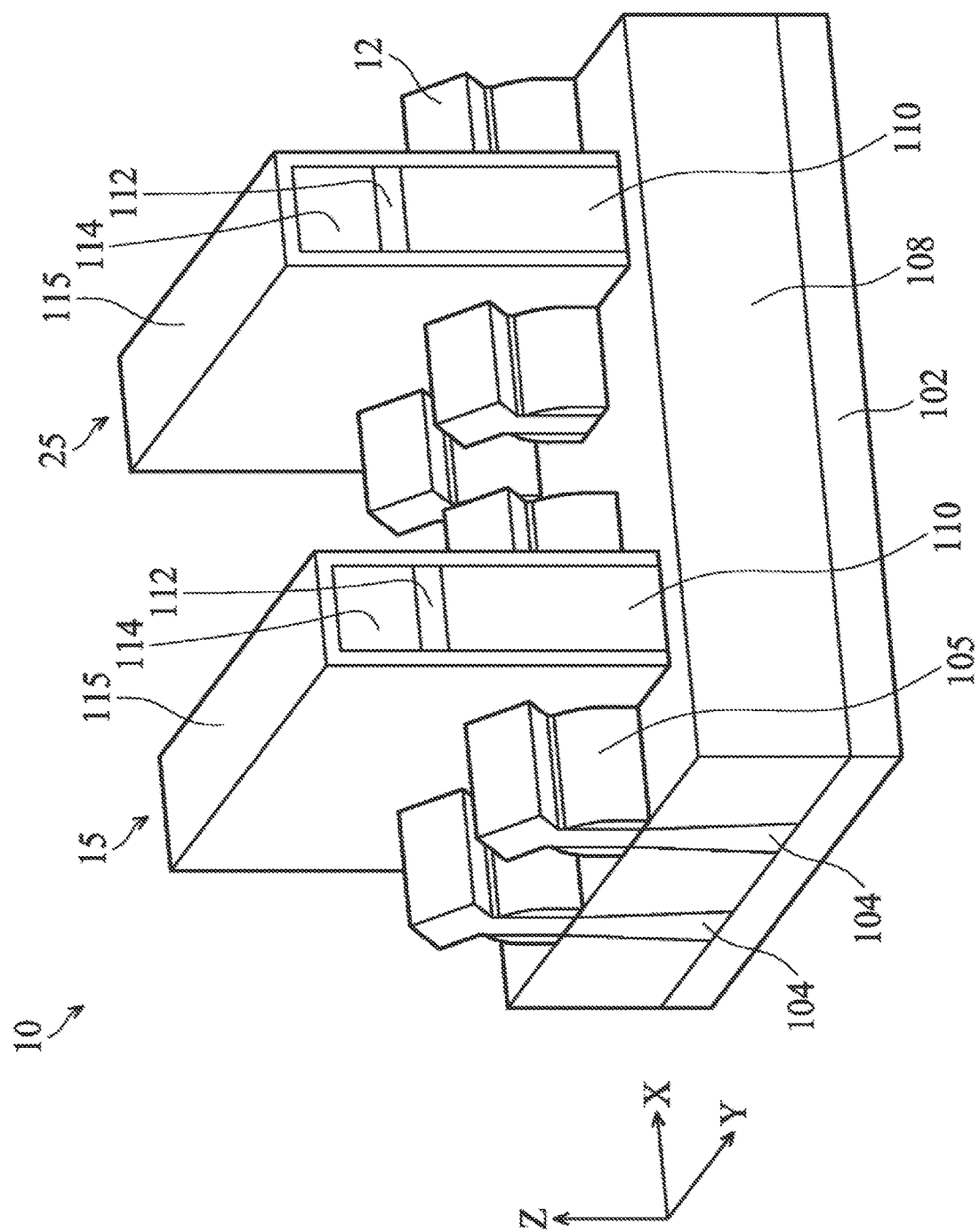
FIG. 1 is a perspective three-dimensional view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Integrated Circuit (IC) devices have been evolving rapidly over the last several decades. A typical IC chip may include numerous active devices such as transistors and passive devices such as resistors, inductors, and capacitors. Recently, negative capacitance devices have been made at least in part via the fabrication of field effect transistors (FETs). In more detail, a negative capacitance device may be formed using a gate structure of a FET device that includes a ferroelectric film. Negative capacitance devices may offer advantages, such as lower subthreshold swing. Subthreshold swing represents the ease of switching the transistor current off and on and is a factor in determining the switching speed of a FET device. Subthreshold swing allows for FET devices having higher switching speed compared to conventional FET devices. Negative capacitance devices may be utilized in application in metal-oxide-semiconductor field-effect transistors (MOSFETs) with very short channel length for ultra-low power computing.

However, conventional negative capacitance devices may still need improvements. For example, conventional negative capacitance devices are formed by embedding a ferroelectric material within a gate stack. As the scaling down process leads to ever-smaller device dimensions, it may be increasingly more difficult to fabricate a small gate stack that embeds the ferroelectric material therein. In addition, due to the small size of the ferroelectric material in conventional negative capacitance devices, the capacitance tuning window may be limited.

To improve upon conventional negative capacitance devices, the present disclosure provides a unique negative capacitance device structure where a ferroelectric structure is formed as a dummy or hybrid structure that is external to the functional transistor. The ferroelectric structure is then electrically coupled to the gate stack of the functional transistor via suitable electrical routing. Such a design allows the ferroelectric structure to not be constrained by the small space that is available within the gate stack of the functional transistor. Consequently, the ferroelectric structure is easier to fabricate. In addition, the larger size of the ferroelectric structure provides a performance boost, as well as additional capacitance tuning capabilities. The various aspects of the present disclosure are now discussed in more detail below with reference to FIGS. 1, 2A-7A, 2B-7B, 8, 9A-9C, and 10-11.

FIG. 1 illustrates a perspective view of an example FinFET device 10. FinFET devices have gained popularity in recent years and may be used to fabricate negative capacitance devices. Therefore, a brief discussion of FinFET devices is given below with reference to FIG. 1.

Referring to FIG. 1, the FinFET device structure 10 may include transistors with different types of conductivity, such as an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOS- FET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. For example, negative capacitance devices may be implement in the form of FinFET devices.

Figure 2A:
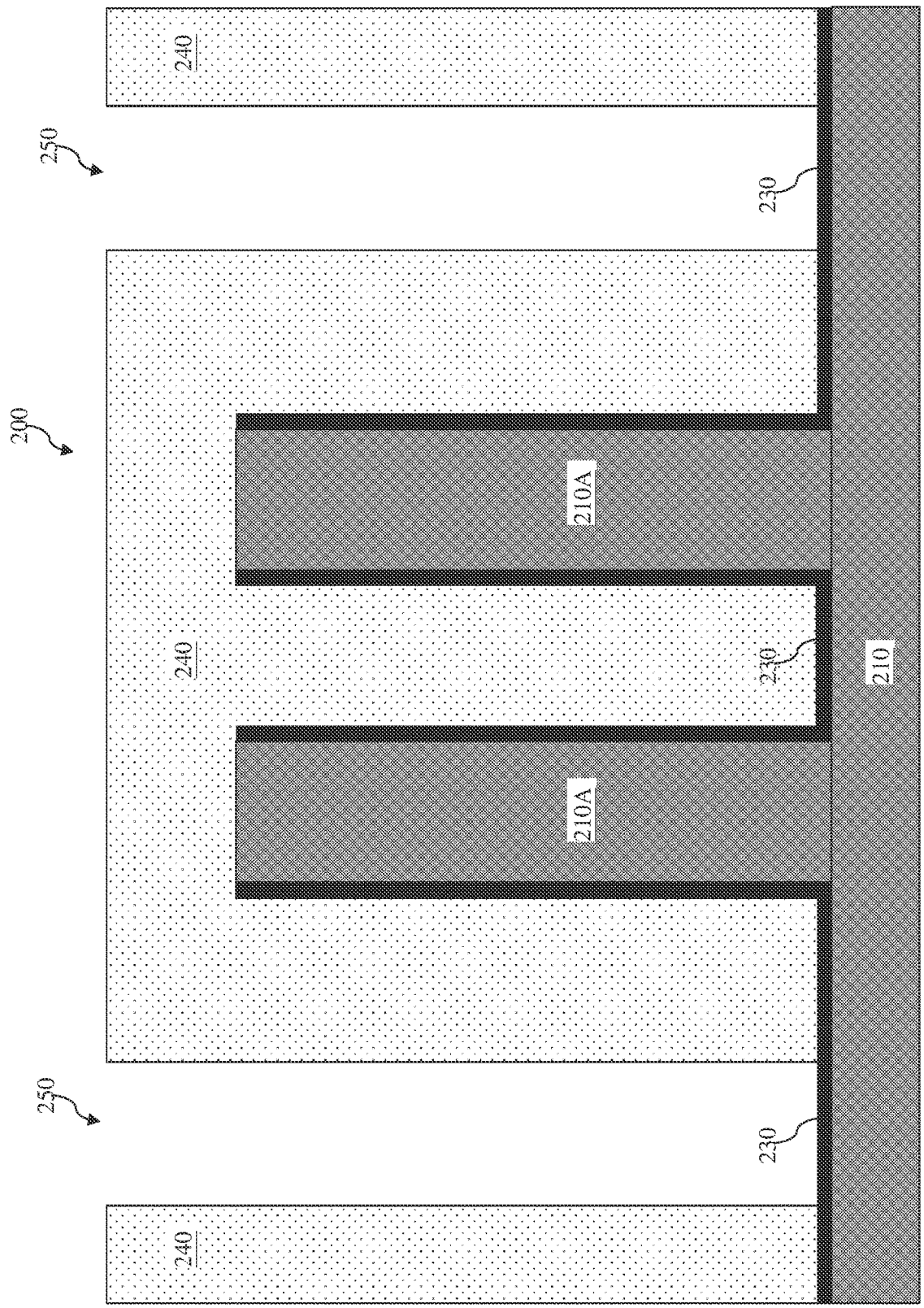
Figure 2B:
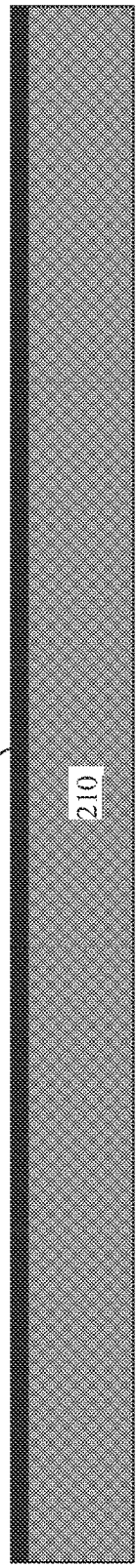

FIGS. 2A and 2B illustrate different diagrammatic fragmentary cross-sectional side views of a semiconductor device 200. The cross-sectional view of FIG. 2A is taken along the Y-Z plane of FIG. 1, and the cross-sectional view of FIG. 2B is taken along the X-Z plane of FIG. 1. As such, FIG. 2A may also be referred to as a Y-cut, and FIG. 2B may also be referred to as an X-cut.

Referring to FIGS. 2A and 2B, the semiconductor 200 includes a substrate 210. The substrate 210 may be an embodiment of the substrate 102 of FIG. 1. For example, the substrate 210 may include silicon or another elementary semiconductor such as germanium. The substrate 210 may also include a compound semiconductor such as silicon carbide, gallium arsenic, indium arsenide, and indium phosphide. The substrate 210 may also include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED).

The substrate 210 may also include various electrical isolation regions such as the isolation structure 108 of FIG. 1. The electrical isolation regions provide electrical isolation between various device regions (such as the doped regions) in the substrate 210. The electrical isolation regions may include different structures formed by using different processing technologies. For example, the electrical isolation regions may include shallow trench isolation (STI) structures. The formation of an STI structure may include etching a trench in the substrate 210 and filling in the trench with one or more insulator materials such as silicon oxide, silicon nitride, silicon oxynitride, or combinations thereof. The filled trench may have a multi-layer structure such as a thermal oxide liner layer with silicon nitride filling the trench. A polishing or planarization process such as chemical mechanical polishing (CMP) may be performed to polish back excessive insulator materials and planarize the top surface of the isolation features.

As shown in FIG. 2A, the semiconductor device 200 further includes fin structures 210A. The fin structures 210A may include semiconductor materials that protrude vertically upward (e.g., in the Z-direction of FIG. 1) out of the substrate 210. The fin structures 210A may be embodiments of the fin structure 104 of FIG. 1.

A liner layer 230 is formed on the upper surfaces of the substrate 210 and on the side surfaces of the fin structures 210A. The liner layer 230 includes a dielectric material, for example it may include silicon nitride (SiN) in some embodiments.

As shown in FIG. 2A, a mask layer 240 is formed over the substrate 210, over the liner layer 230, and over the fin structures 210A. In some embodiments, the mask layer 240 includes a dielectric material that is different from the liner layer 230. For example, the mask layer 240 may include silicon oxide. In some embodiments, the liner layer 230 includes multiple sub-layers with different materials. The mask layer 240 may be formed by depositing a dielectric material through a deposition process such as atomic layer deposition (ALD), followed by a patterning process to form trenches 250 in the deposited dielectric material. The trenches 250 may be formed near the fin structures 210A. For example, one of the trenches 250 is formed to the "left" of one of the fin structures 210A, while the other one of the trenches 250 is formed to the "right" of one of the fin structures 210A. Portions of the mask layer 240 still separate the trenches 250 from the fin structures 210A, of course.

Note that the X-cut of FIG. 2B is taken at a portion of the semiconductor device 200 corresponding to one of the trenches 250. As such, the mask layer 240 and the fin structures 210A are not directly visible in FIG. 2B.

Figure 3A:
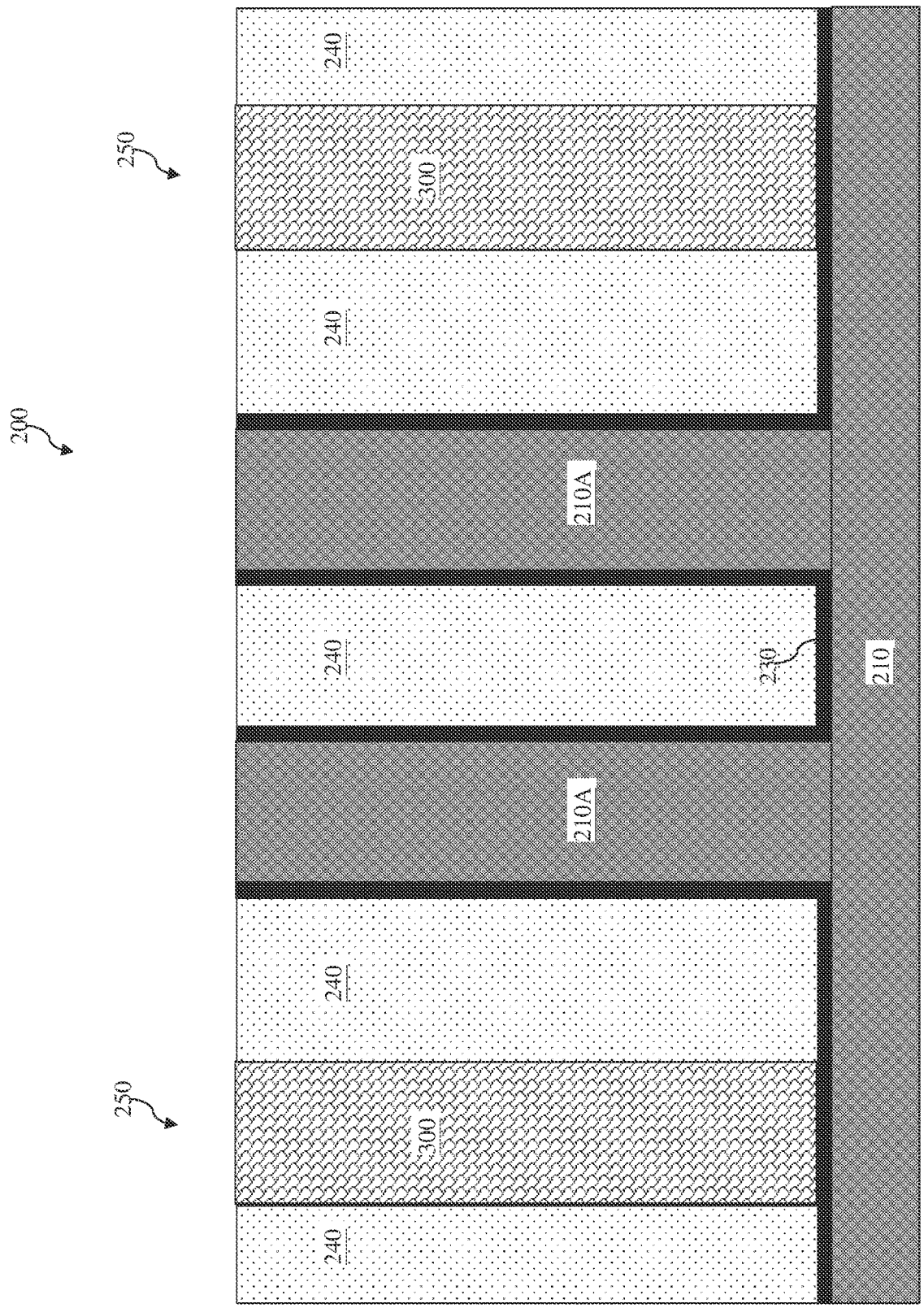
Figure 3B:
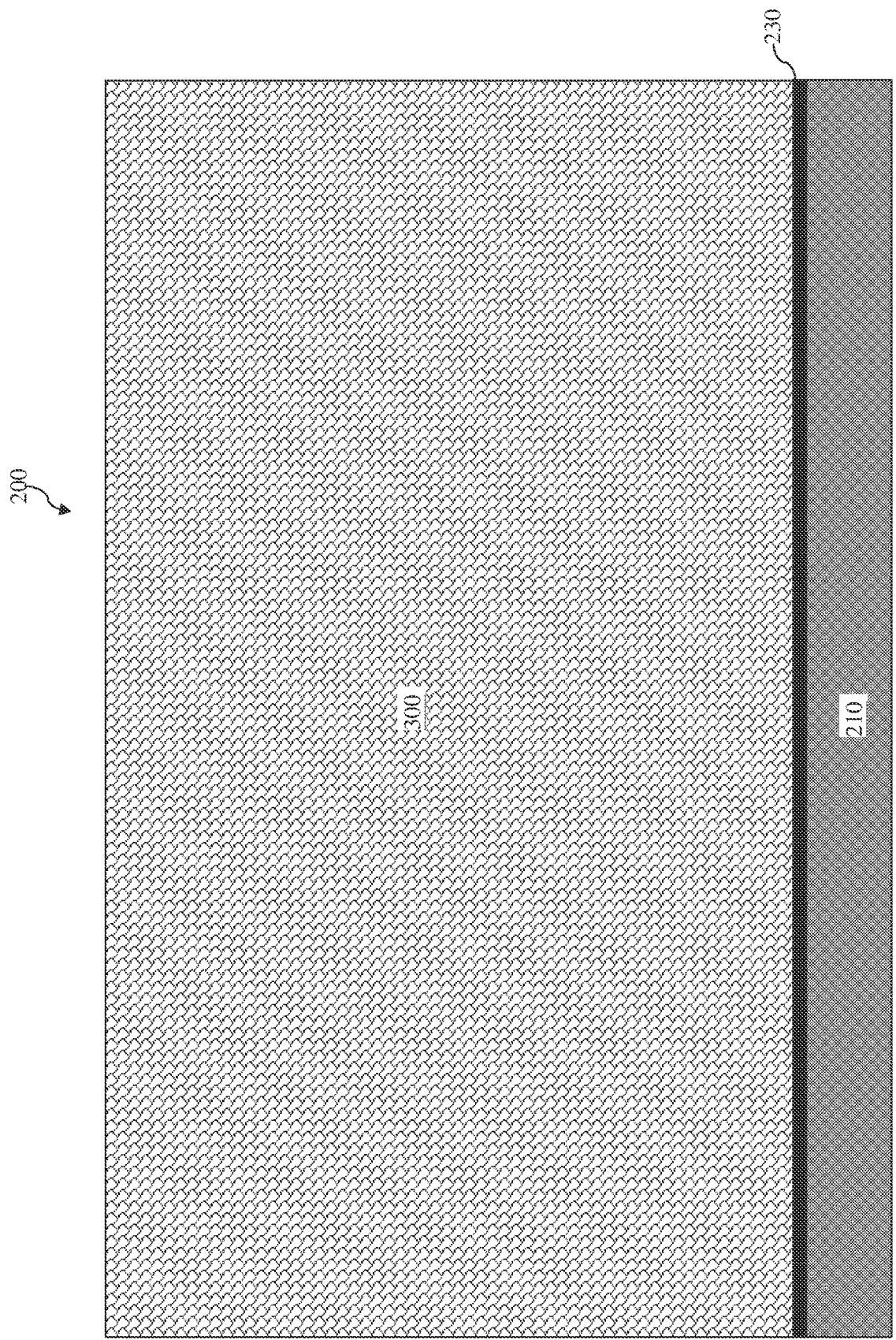

Referring now to FIGS. 3A and 3B, ferroelectric layers 300 are formed in the trenches 250. As non-limiting examples, the ferroelectric layers 300 may include hafnium oxide, hafnium zirconium oxide, hafnium aluminum oxide, lead zirconium titanium oxide, or barium titanium oxide, or combinations thereof. The ferroelectric layers 300 may be formed by a deposition process to fill the trenches 250, followed by a planarization process such as a chemical mechanical polishing (CMP) process to planarize the upper surfaces of the ferroelectric layers 300 with the upper surfaces of the fin structures 210A and the mask layer 240. Since the ferroelectric layers 300 protrude upwardly, similar to how the fin structures 210A protrude upwardly, the ferroelectric layers 300 may be referred to as ferroelectric hybrid fins as well. In some embodiments, the lateral dimensions (e.g., in the X-direction and/or in the Y-direction) of each of the hybrid fins/ferroelectric layers 300 may be substantially equal to the lateral dimensions of each of the fin structures 210A. In some other embodiments, the lateral dimensions (e.g., in the X-direction and/or in the Y-direction) of each of the hybrid fins/ferroelectric layers 300 may be different from the lateral dimensions of each of the fin structures 210A.

Figure 4A:
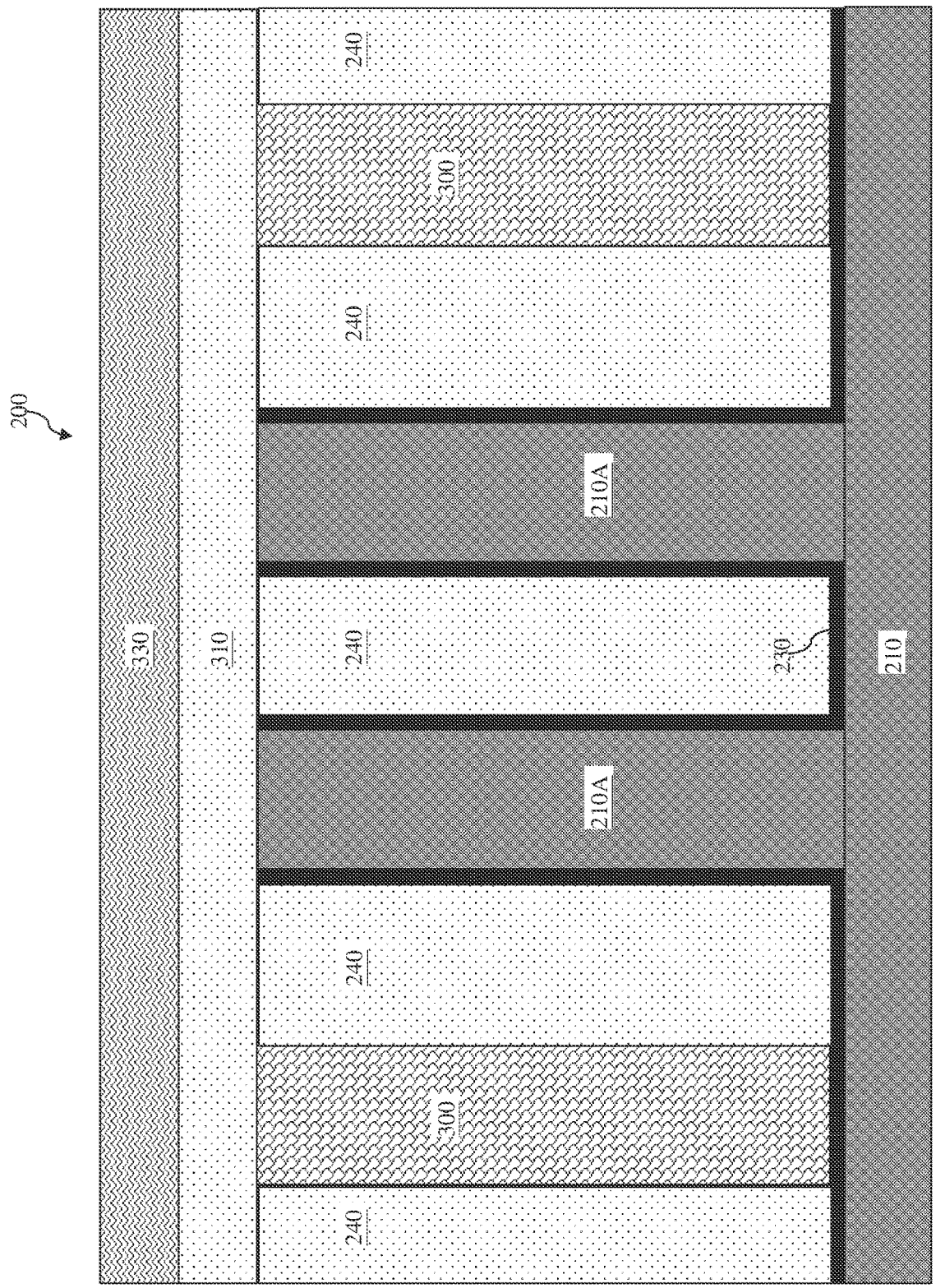

Referring now to FIGS. 4A and 4B, a sacrificial layer 310 is formed over the planarized upper surfaces of the ferroelectric layers 300, the mask layer 240, and the fin structures 210A. The sacrificial layer 310 may be formed by a suitable deposition process and may include a dielectric material such as silicon oxide. Thereafter, a photoresist material 330 may be formed over the sacrificial layer 310, for example using a spin coating process. The photoresist material 330 is then patterned (e.g., via photolithography processes such as exposure, baking, developing, etc.) to form a patterned photoresist mask 330 that includes an opening 350, as shown in FIG. 4B. The photoresist mask 330 is then used to pattern the sacrificial layer 310. The patterned sacrificial layer 310 is then used to pattern the ferroelectric layers 300 and the liner layers 230 therebelow. In other words, the opening 350 is etched such that it vertically extends through the ferroelectric layers 300 and the liner layers 230, as shown in FIG. 4B. Portions of the substrate 210 are exposed by the openings 350.

Figure 5A:
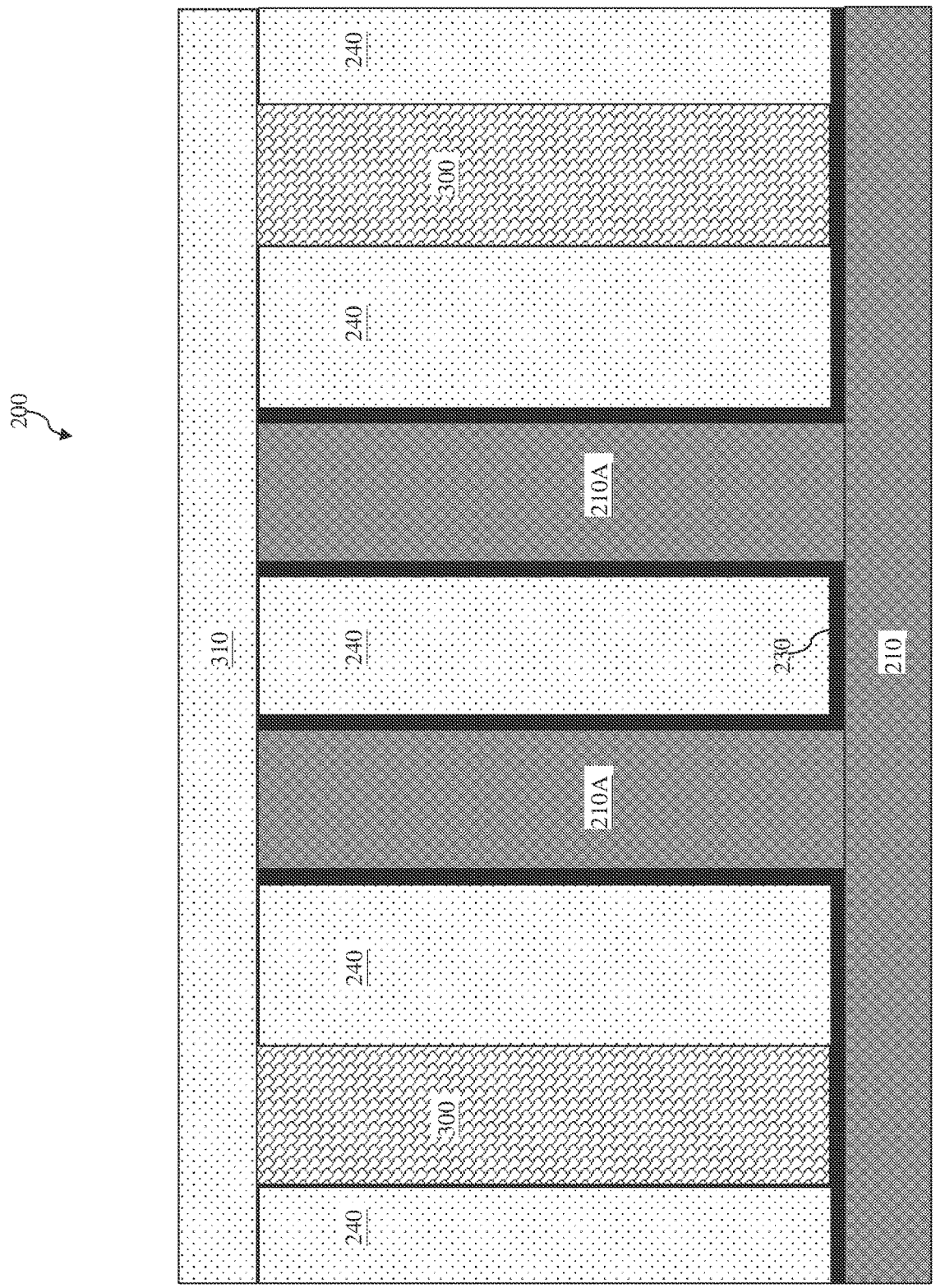
Figure 5B:
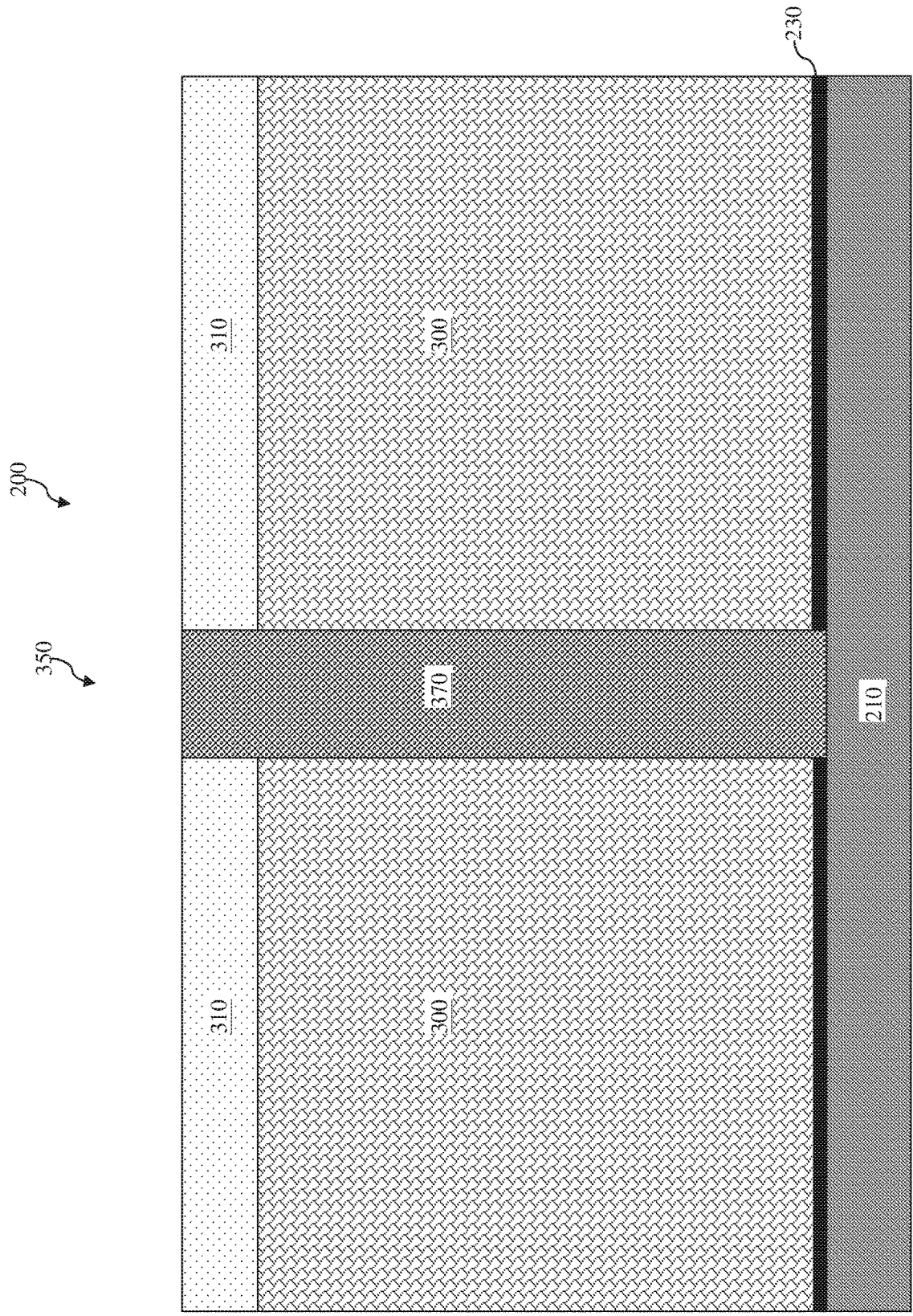

Referring now to FIGS. 5A and 5B, the photoresist layer 330 is removed using a stripping or ashing process. The opening 350 is filled with a dielectric layer 370, for example using a suitable deposition process. As non-limiting examples, the dielectric layer 370 may include silicon nitride, silicon oxide, silicon carbide, or combinations thereof. The dielectric layer 370 provides electrical isolation between the portions of the ferroelectric layer 300 disposed on its opposite sides (e.g., to its left and to its right). The dielectric layer 370 may also be referred to as a ferroelectric hybrid fin blocker. In some embodiments, the sacrificial layer 310 may also be removed before or after the formation of the dielectric layer 370.

Figure 6A:
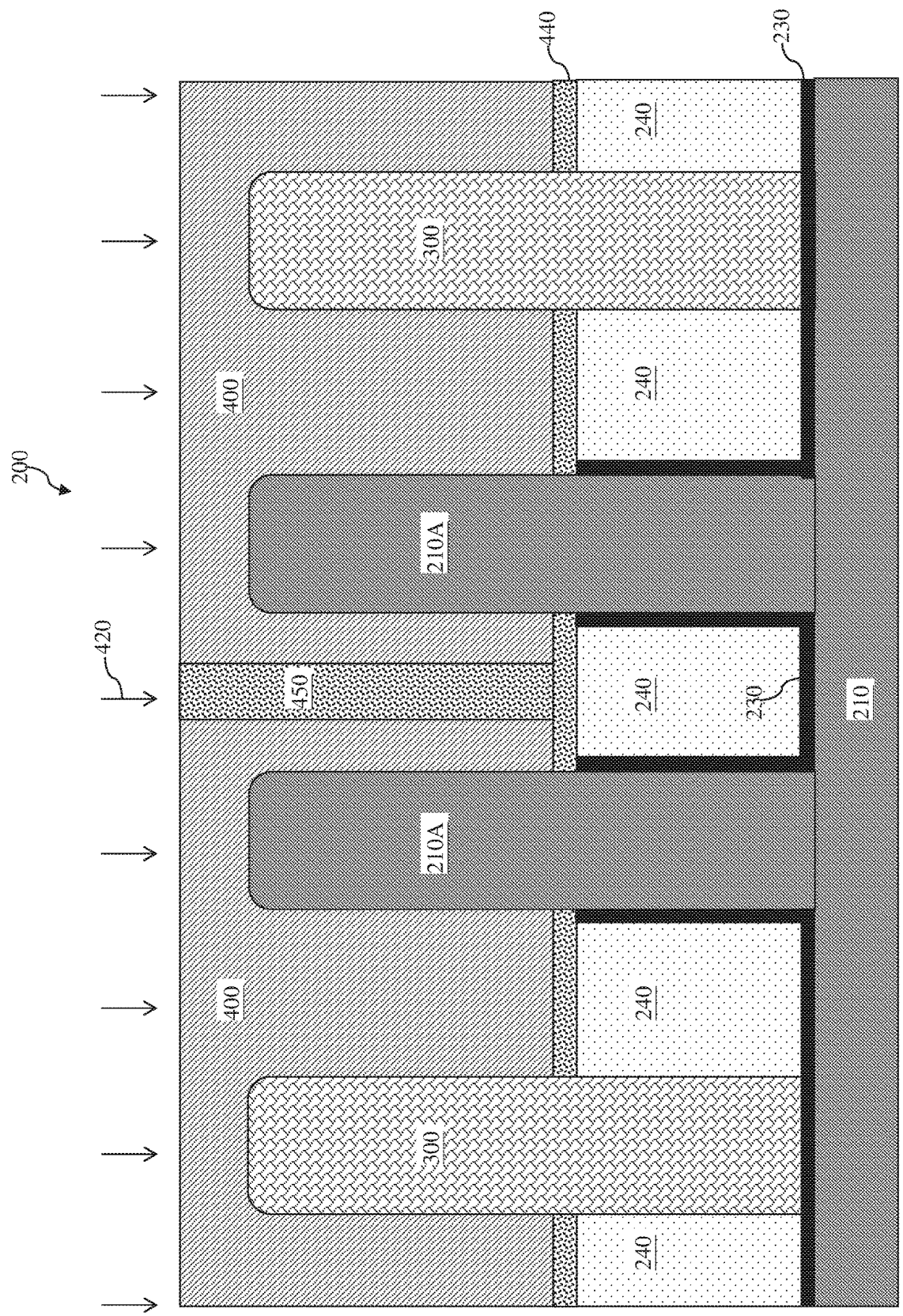
Figure 6B:
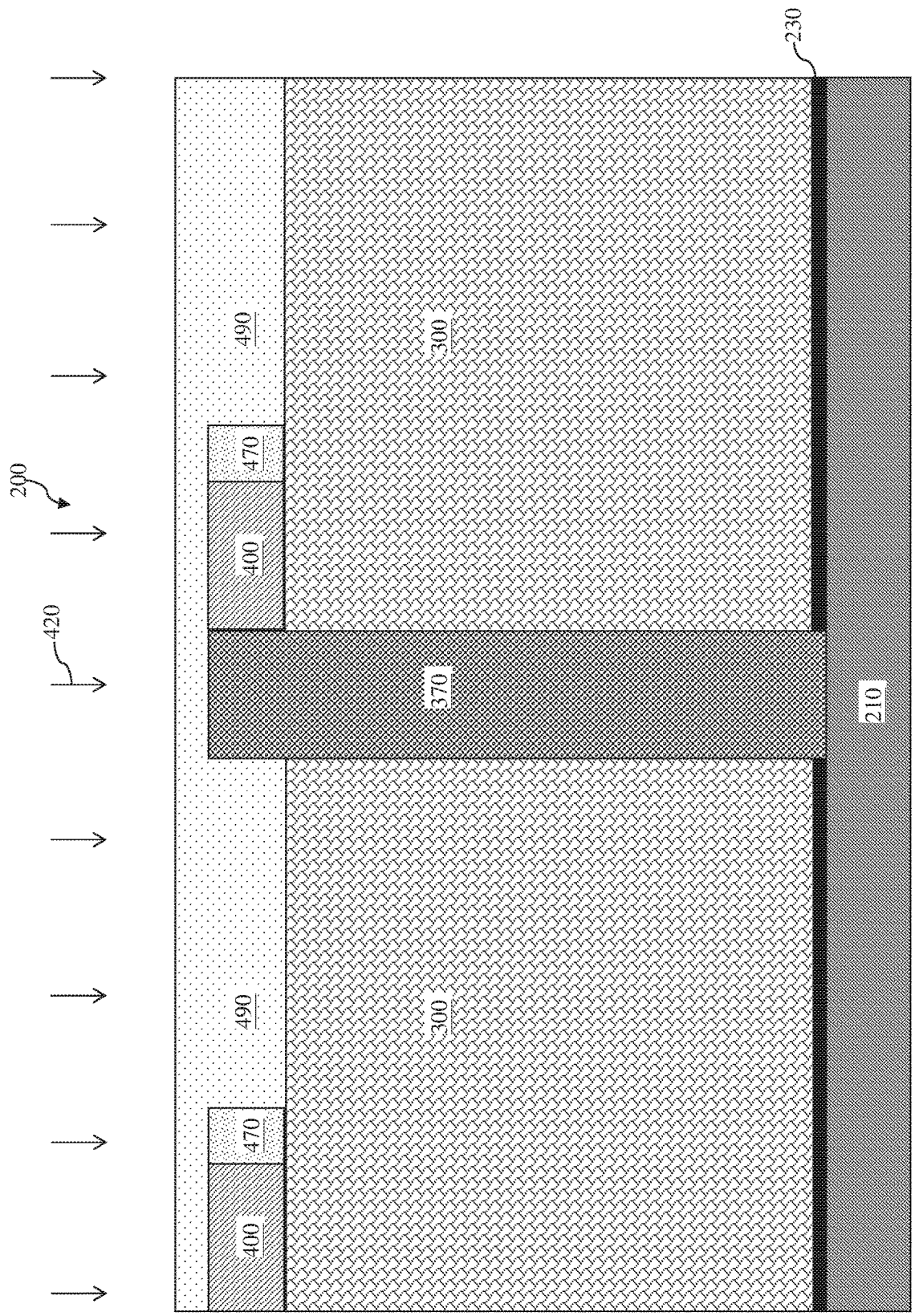

Referring now to FIGS. 6A and 6B, dummy gate structures 400 may be formed using a process 420. First, the sacrificial layer 310 is removed, if it has not been removed by the preceding processes already. The mask layer 240 (and portions of the liner layer 230 disposed on its sidewalls) is partially recessed via one or more etching processes of the process 420, such that an upper portion of each of the fin structures 210A and an upper portion of each of the ferroelectric layers 300 becomes exposed. This may be referred to as a fin-recessing process. As shown in FIG. 6A, the upper corners of the fin structures 210A and the upper corners of the ferroelectric layers 300 may also become somewhat rounded as a result of the fin-recessing process.

A dielectric layer 440 is then formed over the upper surfaces of the remaining portions of the mask layer 240. In some embodiments, the dielectric layer 440 include an oxide material. The dummy gate structures 400 may then be formed over the fin structures 210A and the ferroelectric layers 300. For example, the dummy gate structures 400 may each be formed to partially wrap around the fin structures 210A and the ferroelectric layers 300, similar to how the gate electrode 110 partially wraps around the fin structure 104 of FIG. 1. The dummy gate structures 400 each extend in an elongated manner in the Y-direction (as shown in FIG. 6A) and are separated from each other in the X-direction (as shown in FIG. 6B). In some embodiments, the dummy gate structures 400 may each include a dummy gate dielectric and a dummy gate electrode. For example, the dummy gate dielectric may include silicon oxide, and the dummy gate dielectric may include polysilicon. In some embodiments, the dielectric layer 440 forms the dummy gate dielectric of the dummy gate structures.

As shown in FIG. 6A, an otherwise continuous dummy gate structure 400 may be divided into separate dummy gate structures 400 by the formation of a dielectric component 450, which is formed in between the fin structures 210A. Also as shown in FIG. 6B, gate spacers 470 may be formed on sidewalls of the dummy gate structures 400.

Source/drain regions may then be formed, for example by epitaxially growing an epilayer on the portions of the fin structures 210A outside the dummy gate structures 400. The source/drain regions may also be doped by an N-type or P-type dopant, depending on the type of transistor desired (e.g., NFET or PFET). Channel regions are formed by portions of the fin structures 210A that are located between the source region and the drain region and beneath (or being wrapped around by) the dummy gate structures 400.

An interlayer dielectric (ILD) 490 is formed over the ferroelectric layers 300 and the dummy gate structures 400 and around the gate spacers 470, as shown in FIG. 6B. As shown in FIG. 6B, the upper surface of the ILD 490 is disposed higher than the dummy gate structures 400, which may be internal gates. In some embodiments, the ILD 490 includes a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD 490 may include silicon oxide or silicon nitride, or combinations thereof.

Figure 7A:
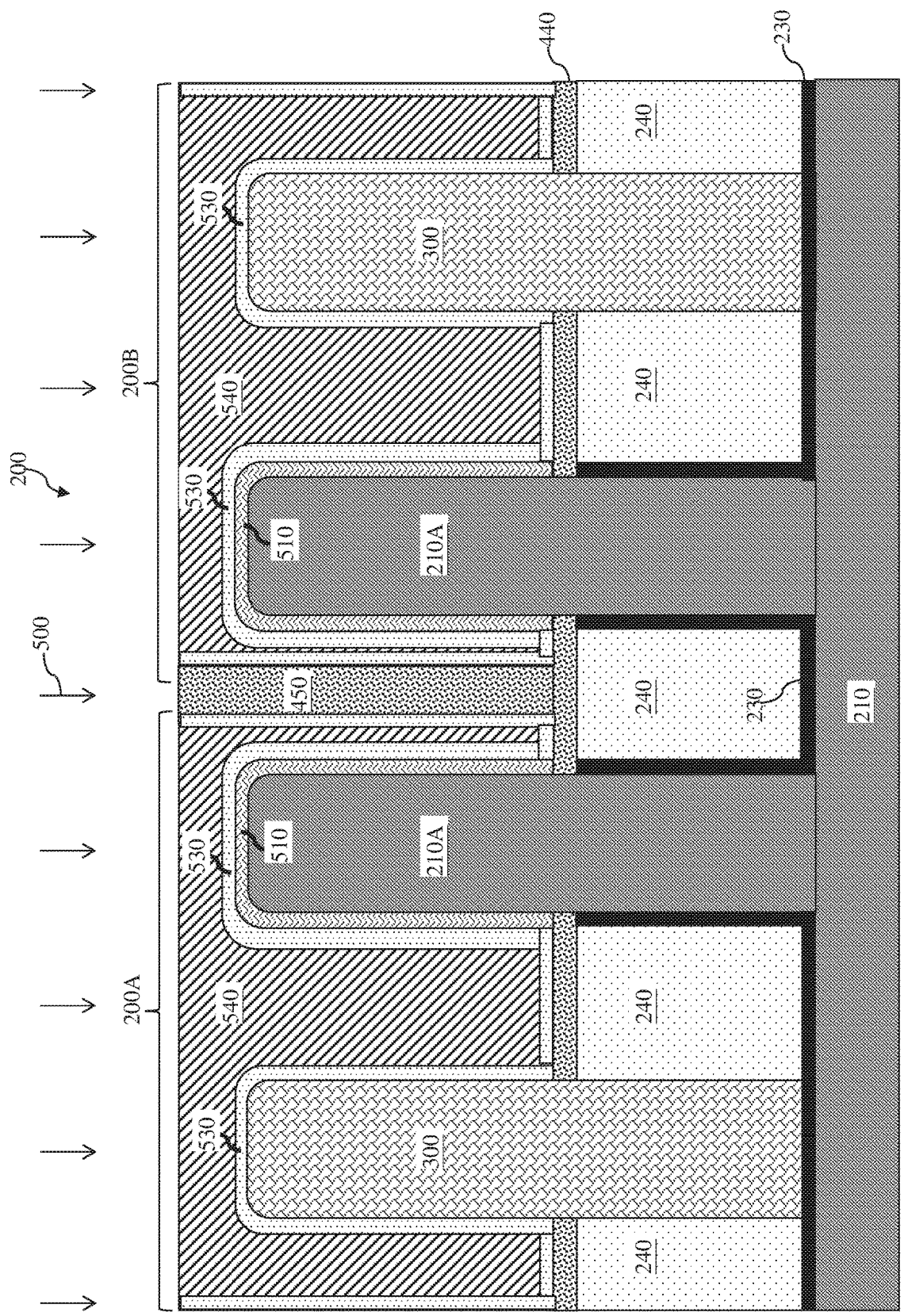
Figure 7B:
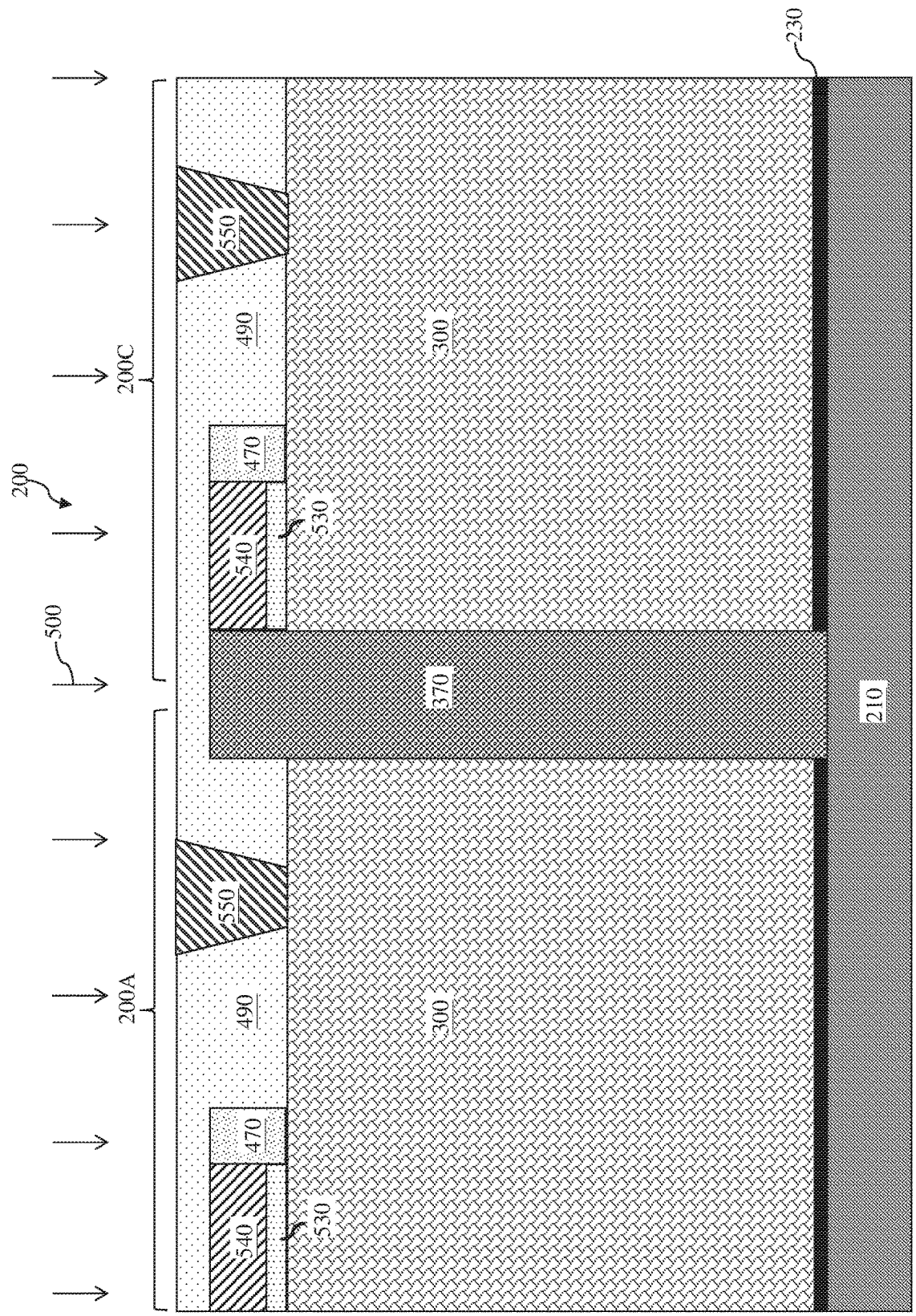

Referring now to FIGS. 7A and 7B, a gate replacement process 500 is performed to replace the dummy gate structures 400 with high-k metal gate (HKMG) structures, which may include an interfacial layer 510, a high-k gate dielectric 530, and a metal gate electrode 540. In some embodiments, the gate replacement process 500 may include one or more etching processes to etch away the dummy gate structures 400. The removal of the dummy gate structures 400 may form openings in the ILD 490, which are then filled with the interfacial layer 510, the high-k gate dielectric 530, and the metal gate electrode 540 via a plurality of deposition processes.

In some embodiments, the interfacial layer 510 includes an oxide material such as silicon oxide, or another suitable dielectric layer. The interfacial layer 510 serves as an interface between the channel (e.g., the portion of the fin structures 210A under the gate) and the high-k gate dielectric 530. As shown in FIG. 7A, the interfacial layer 510 is formed on the upper surfaces and side surfaces of the fin structures 210A, but not on the ferroelectric layer 300. This is because unlike the fin structures 210A, the ferroelectric layer 300 is not a semiconductor material and therefore does not need an interface between the semiconductor material and the high-k gate dielectric 530 to be formed thereon.

The high-k gate dielectric 530 is formed on the interfacial layer 510 as well as on the upper surfaces and side surfaces of the ferroelectric layers 300. In some embodiments, the high-k gate dielectric 530 may include a material having a dielectric constant that is greater than a dielectric constant of $SiO_2$, which is approximately 4. In an embodiment, the high-k gate dielectric 530 includes hafnium oxide ($HfO_2$), which has a dielectric constant that is in a range from approximately 18 to approximately 40. In alternative embodiments, the high-k gate dielectric 530 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode 540 is formed on the high-k gate dielectric 530 and may be implemented as an embodiment of the gate electrode 110 of FIG. 1. In some embodiments, the metal gate electrode 540 may include a work function metal component and a fill metal component. The work functional metal component is configured to tune a work function of its corresponding transistor to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the HKMG gate structure. In various embodiments, the fill metal component may contain Aluminum (Al), Tungsten (W), Copper (Cu), or combinations thereof. The metal gate electrode 540 is electrically coupled to the ferroelectric layers 300 through the high-k gate dielectric 530.

After the formation of the HKMG structures, conductive structures such as conductive structures or conductive contacts may also be formed to provide electrical connectivity to the various components of the semiconductor device 200, for example to the ferroelectric layer 300. As an example, as shown in FIG. 7B, a conductive structure 550 is formed over each of the ferroelectric layers 300 and is therefore electrically coupled to the ferroelectric layers 300. A voltage to the gate of the transistor may be applied through the conductive structure 550. In other words, the conductive structure 550 may serve as the gate input of the transistor of a negative capacitance device (e.g., the semiconductor device 200). It is understood that the conductive structure 550 may then be electrically connected to other microelectronic components using a multi-layer interconnect structure, for example through one or more metal lines in any given metal layer of the multi-layer interconnect structure.

It is understood that the semiconductor device 200 may include different transistors of different types of conductivity. For example, the fin structure 210A, the ferroelectric layer 300, and the metal gate electrode 540 on the left side of FIG. 7A may form an N-type transistor 200A, while the fin structure 210A, the ferroelectric layer 300, and the metal gate electrode 540 on the right side of FIG. 7A may form a P-type transistor 200B. As another example, a portion of the N-type transistor 200A is also shown in FIG. 7B, while another N-type transistor 200C is disposed laterally adjacent to the N-type transistor 200A.

Figure 7C:
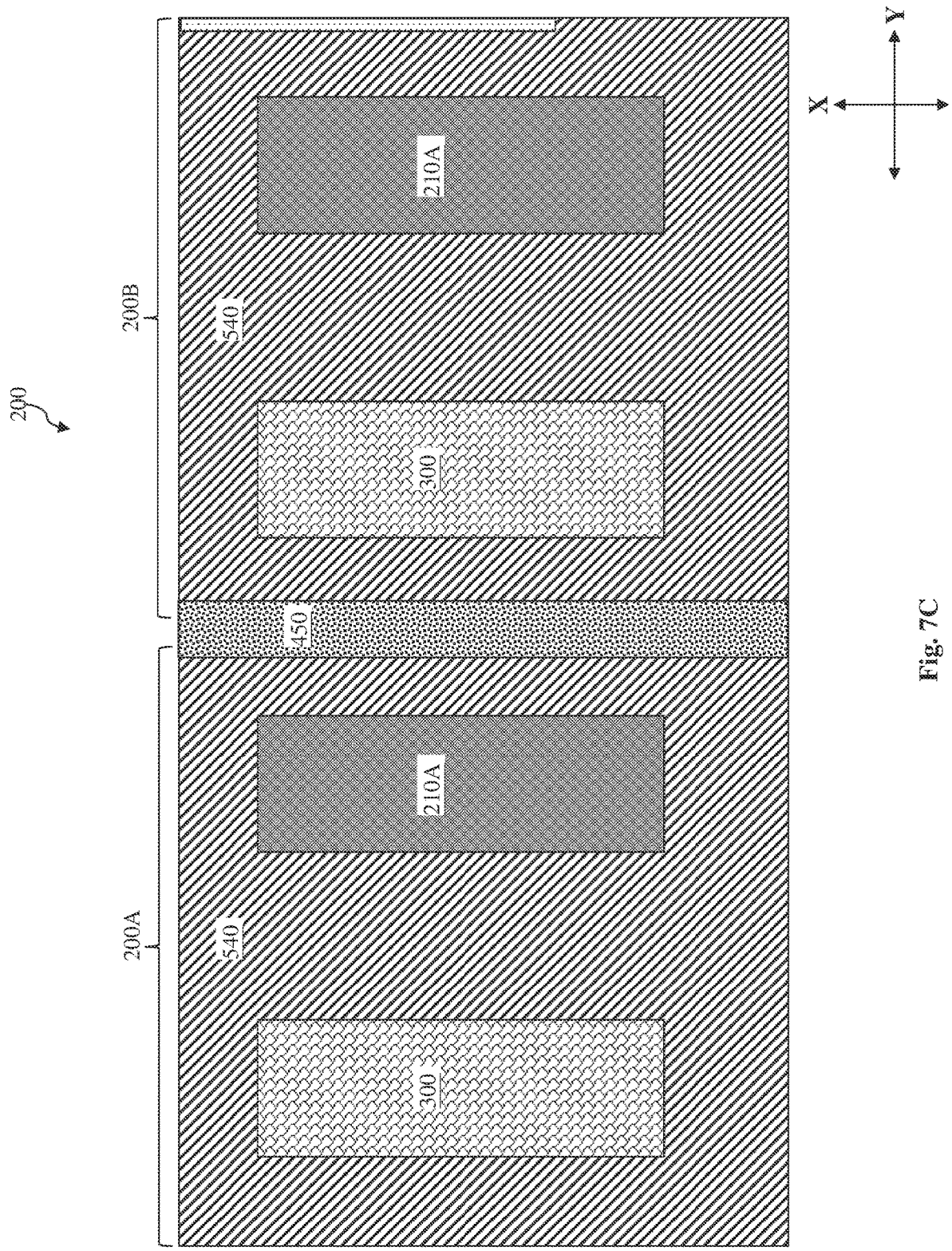
FIG. 7C is a top view of an example semiconductor device in accordance with some embodiments.

FIG. 7C illustrates a simplified fragmentary top view of the semiconductor device 200 in accordance with some embodiments. The top view corresponds to a horizontal plane defined by the X-direction and the Y-direction of FIG. 1. For reasons of simplicity, some of the layers or components are omitted from FIG. 7C. The top view illustrates the metal gate electrode 540. Underneath the metal gate electrode 540 are the layers 510 and 530, but these layers are omitted from FIG. 7C for reasons of simplicity. Instead, the outlines or contours of the ferroelectric layers 300 (e.g., hybrid fins) and the fin structures 210A are illustrated, even though it is understood that these components may not be directly visible in the top view since they are covered by the metal gate electrode 540. In any case, it can be seen that the ferroelectric layers 300 and the fin structures 210A may each extend in an elongated manner in the X-direction, and they are separated from one another in the Y-direction. In some embodiments, the dimension of each of the ferroelectric layers 300 may be substantially equal to the dimension of each of the fin structures 210A in the X-direction and/or in the Y-direction. In some other embodiments, the dimension of each of the ferroelectric layers 300 may be substantially different from the dimension of each of the fin structures 210A in the X-direction and/or in the Y-direction.

Referring back to FIG. 7A, the metal gate electrode 540 partially wraps around both the fin structures 210A (which include the channel region of the transistor), as well as the ferroelectric layers 300. Again, the ferroelectric layers 300 serve as hybrid fin structures herein, but they also provide negative capacitance tuning, since they are electrically coupled to the metal gate electrodes 540 as discussed above.

For example, FIG. 8 illustrates a capacitance model according to embodiments of the present disclosure. The capacitance model corresponds to a portion of the negative capacitance transistor between electrical ground (Gnd) and a gate voltage (Vg) node. A capacitance of the MOS transistor is denoted as $C_{MOS}$, which is made up of a gate oxide capacitance $C_{OX}$ and a depletion region capacitance $C_S$. $C_{OX}$ may be determined by the material compositions and/or the thicknesses of the interfacial layer 510 and the high-k dielectric layer 530, and $C_S$ may be determined by the process conditions and designs of the source/drain regions and the channel region. The capacitance model further includes $C_{FE}$, which represent a capacitance of the ferroelectric layer 300. $C_{FE}$ may be determined by the material composition and/or the thickness of the ferroelectric layer 300.

In order to optimize the performance of negative capacitance devices, capacitance matching may be needed. For example, the various capacitances discussed above may be adjusted based on factors such as thickness or material composition. Conventional negative capacitance devices may form a ferroelectric layer that is between the channel region of a transistor and a gate electrode of a transistor, and as such it may be constrained in terms of size, particularly as device scaling down continues. In contrast, the present disclosure implements the ferroelectric layer 300 outside the gate dielectric of the transistor. For example, the ferroelectric layer 300 is physically separated from the channel region (e.g., the portion of the fin structure 210A shown in FIG. 7A), the interfacial layer 510, and the high-k gate dielectric 530. As such, the ferroelectric layer 300 is not constrained by the size of the gate dielectric or the amount of room between the channel region and the gate electrode 540. Rather, since the ferroelectric layer 300 is implemented as a hybrid fin structure that is besides the fin structure 210A (and the gate dielectric layers formed thereon), the ferroelectric layer 300 can be formed with a much greater size than what is possible in conventional negative capacitance devices. For example, the ferroelectric layer 300 can have a size that is approximately the size of the fin structure 210A.

Meanwhile, the ferroelectric layer 300 is still electrically coupled to the functional transistor through the metal gate electrode 540, because the metal gate electrode wraps around (and is in physical contact) with both the fin structure 210A and the ferroelectric layer 300, and a continuous high-k dielectric layer 530 is formed over both the ferroelectric layer 300 and the fin structure 210A. The ferroelectric layer 300 is also electrically coupled to the conductive structure 550, which provides electrical connectivity to the gate terminal of the functional transistor (e.g., the transistor 200A or 200B) through the ferroelectric layer 300. Therefore, although the present disclosure differs structurally from conventional negative capacitance devices (due to the external implementation of the ferroelectric layer), the electrical routing scheme discussed above still allows it to achieve the advantages provided by conventional negative capacitance devices. In fact, the flexibility to control/configure the size and location of the ferroelectric layer 300 may provide additional negative capacitance tuning freedom, which offers a more versatile negative capacitance device than conventional negative capacitance devices. As such, the implementation of the ferroelectric structure that is external to the gate stack improves capacitance matching.

FIGS. 9A-9C illustrate remanent polarization v.s. coercive field plots of various materials. For example, FIG. 9A is a graph illustrating remanent polarization (Y-axis) v.s. coercive field (X-axis) for hafnium oxide. The hafnium oxide material is associated with a monolithic phase. FIG. 9B is a graph illustrating remanent polarization v.s. coercive field for zirconium oxide. The zirconium oxide has a tetragonal phase. FIG. 9C is a graph illustrating remanent polarization v.s. coercive field for hafnium oxide doped with zirconium. The hafnium oxide doped with zirconium has an orthorhombic phase. As is seen in FIG. 9C, the graph of remanent polarization v.s. coercive field for hafnium oxide doped with zirconium has a hysteresis, shaped similar to an S-curve. This is what is desired for a negative capacitance ferroelectric material, and it may be achieved by capacitance tuning. As discussed above, the external ferroelectric structure provides additional flexibility for capacitance tuning and thus may facilitate the achievement of the hysteresis.

It is understood that although aspects of the present disclosure have been explained using a FinFET device as an example, the present disclosure may apply to non-FinFET devices too, such as planar devices. For example, FIG. 10 illustrates a cross-sectional side view of a negative capacitance device 700 that is implemented as a planar transistor, as opposed to a FinFET transistor of the semiconductor device 200 in FIGS. 7A-7B. Referring now to FIG. 10, the semiconductor device 200 includes a substrate 710. The substrate 710 may include a silicon material or another suitable material of the substrate 210 discussed above. A source region 705 and a drain region 706 are formed in the substrate 710, for example by doping portions of the substrate 710. A channel region 710A is formed by a portion of the substrate 710 disposed between the source region 705 and the drain region 706.

An interfacial layer 720 is formed over the channel region 710A. In some embodiments, the interfacial layer 720 includes a dielectric material such as silicon oxide. A high-k gate dielectric layer 730 is formed over the interfacial layer 720. The high-k gate dielectric layer 730 may include any of the materials of the high-k gate dielectric layer 530 discussed above. A metal gate electrode layer 740 is formed over the high-k gate dielectric layer 730. The metal gate electrode layer 740 may include any of the materials of the metal gate electrode 540 discussed above. It is understood that the interfacial layer 720, the high-k gate dielectric layer 730, and the metal gate electrode layer 740 may collectively be considered a gate structure or a gate stack. In some embodiments, the bottom surface of such a gate stack (e.g., the bottom surface of the interfacial layer 720) is substantially co-planar with the top surface of the isolation structure 750.

An isolation structure 750 may be disposed laterally adjacent to the substrate 710. In some embodiments, the isolation structure 750 may be in physical contact with one of the source region 705 and the drain region 706. In other embodiments, additional components may be implemented between the isolation structure 750 and the source region 705 but are not specifically illustrated herein for reasons of simplicity. The isolation structure 750 may include a dielectric material for providing electrical isolation, such as silicon oxide.

A conductive electrode 760 is formed over the isolation structure 750. The conductive electrode 760 may be formed by depositing and subsequently patterning a conductive material. In some embodiments, the conductive electrode 760 may include a titanium nitride material. A ferroelectric layer 770 is formed over the conductive electrode 760. In some embodiments, the ferroelectric material may include any of the materials of the ferroelectric layer 300 discussed above. Another conductive electrode 780 is formed over the ferroelectric layer 770. The conductive electrode 780 may be formed by depositing and subsequently patterning a conductive material, for example a silicon nitride material. In some embodiments, the ferroelectric layer 770 and the conductive electrode 780 may be patterned together, though this is not required. In some embodiments, the conductive electrode 780 has surface area in a top view that is smaller than, or equal to, a surface area of the conductive electrode 760 in the top view.

As shown in FIG. 10, the ferroelectric layer 770 is disposed physically outside of, or external to, the functional transistor formed by the source region 705, the drain region 706, the channel region 710A, the interfacial layer 720, the high-k gate dielectric layer 730, and the metal gate electrode layer 740. In other words, instead of being sandwiched between the channel region 710A and the metal gate electrode 740, which would have entailed significant space and size restrictions, the ferroelectric layer 770 is formed external to the gate stack. This allows much greater flexibility in configuring the size, shape, and/or location of the ferroelectric layer 770. Nevertheless, the ferroelectric layer 770 is still electrically coupled to the gate stack. For example, an electrical connection mechanism 790 may be used to electrically connect the conductive electrode 780 (which is electrically connected to the ferroelectric layer 770) to the metal gate electrode 740. In some embodiments, the electrical connection mechanism 790 may include a metal line of a multilayer interconnect structure. As such, although the ferroelectric layer 770 is implemented physically external to the gate stack, it is still electrically coupled to the gate stack and therefore allows for negative capacitance tuning as well.

In the embodiment shown in FIG. 10, an electrical terminal Vs is coupled to the source region 705, an electrical terminal Vd is coupled to the drain region 706, and an electrical terminal Vg is coupled to the conductive electrode 760. The electrical terminals Vs, Vd, and Vg may be implemented as conductive contacts or conductive structures of the multilayer interconnect structure. Since the conductive electrode 760 is also electrically connected to the ferroelectric layer 770, and since the ferroelectric layer 770 is electrically coupled to the metal gate electrode layer 740, the electrical terminal Vg is electrically coupled to the metal gate electrode layer 740 and provides electrical connectivity to the gate terminal of the functional transistor. The electrical terminals Vs and Vd provide electrical connectivity to the source terminal and the drain terminal of the functional transistor, respectively. Again, the implementation of the ferroelectric layer 770 externally to the gate stack in the planar transistor embodiment provides advantages similar to those discussed above with reference to the FinFET embodiment.

Figure 11:
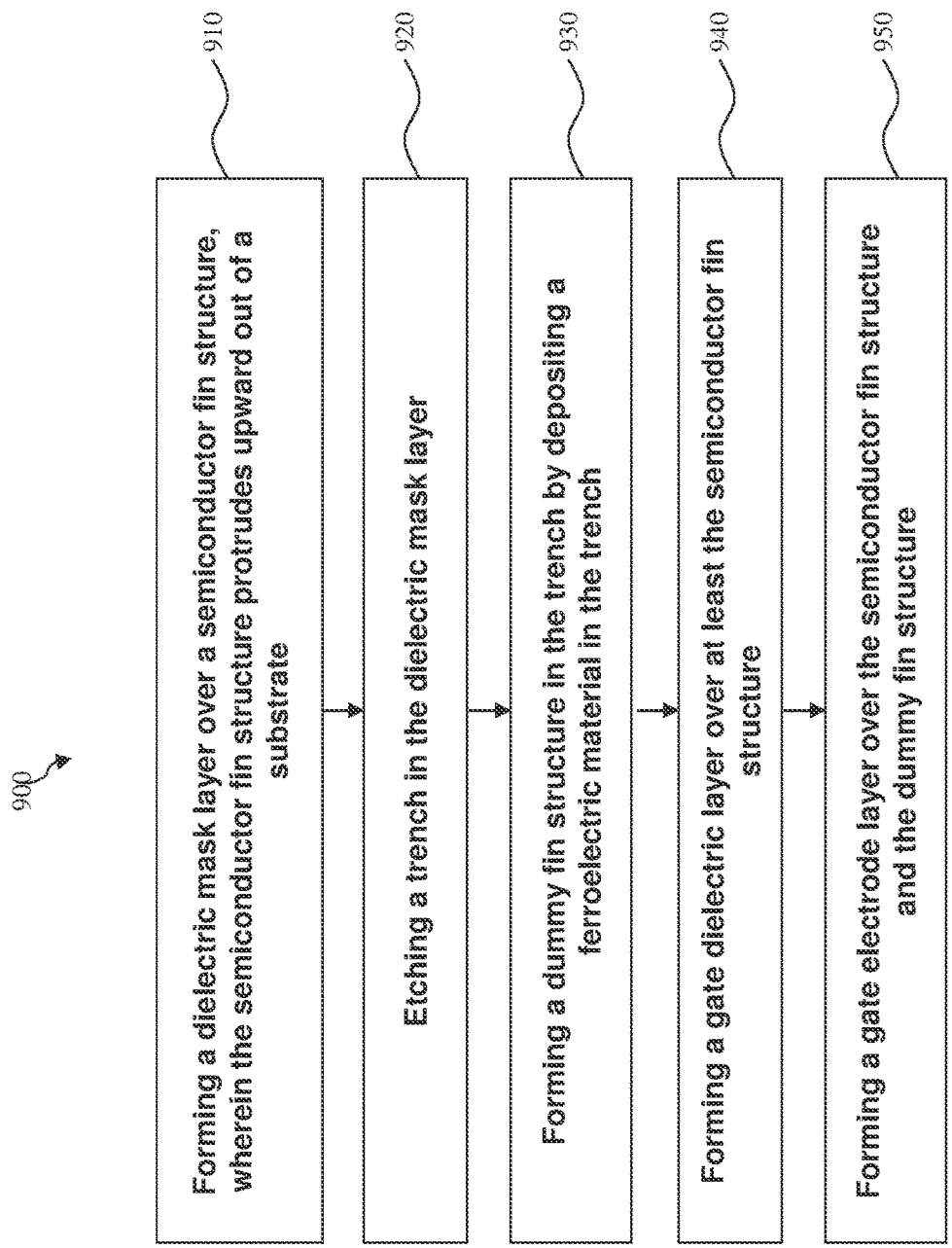
FIG. 11 is a flowchart of an example method for fabricating a semiconductor device constructed in accordance with some embodiments.

FIG. 11 is a flowchart of a method 900 of fabricating a semiconductor device. The method 900 includes a step 910 of forming a dielectric mask layer over a semiconductor fin structure. The semiconductor fin structure protrudes upward out of a substrate.

The method 900 includes a step 920 of etching a trench in the dielectric mask layer.

The method 900 includes a step 930 of forming a hybrid fin structure in the trench by depositing a ferroelectric material in the trench. In some embodiments, the ferroelectric material contains hafnium oxide, hafnium zirconium oxide, hafnium aluminum oxide, lead zirconium titanium oxide, barium titanium oxide, or combinations thereof. In some embodiments, an opening is formed to vertically extend through the hybrid fin structure. The opening is filled with an electrically insulating material.

The method 900 includes a step 940 of forming a gate dielectric layer over at least the semiconductor fin structure.

The method 900 includes a step 950 of forming a gate electrode layer over the semiconductor fin structure and the hybrid fin structure. In some embodiments, the forming of the gate electrode layer comprises forming a metal gate electrode layer that wraps around both the semiconductor fin structure and the hybrid fin structure.

In some embodiments, the depositing comprises depositing hafnium oxide that is doped with zirconium.

It is understood that additional processes may be performed before, during, or after the steps 910-950 of the method 900. For example, the method 900 may include a step of forming an interfacial dielectric layer over the semiconductor fin structure but not over the hybrid fin structure. In some embodiments, the forming of the gate dielectric layer comprises depositing a high-k dielectric material over the interfacial dielectric layer and over the hybrid fin structure. As another example, the method 900 includes a step of electrically coupling the ferroelectric material with a conductive structure. The conductive structure may be a part of an interconnect structure that includes: metal lines distributed in multiple metal layers, contacts to connect the metal lines to devices (such as sources, drains and gates), and vias to vertically connect metal lines in the adjacent metal layers. The formation of the interconnect structure may include damascene process or other suitable procedure. The metal components (metal lines, contacts and vias) may include copper, aluminum, tungsten, metal alloy, silicide, doped polysilicon, other suitable conductive materials, or a combination thereof. Other processes may include processes such as testing and packaging. For reasons of simplicity, these additional steps are not discussed herein in detail.

In summary, the present disclosure forms a negative capacitance capacitor that includes a ferroelectric structure external to the gate stack. In some embodiments, the ferroelectric structure is implemented as a hybrid fin structure that is disposed physically separate to, but electrically coupled to, a semiconductor fin structure of the gate stack. For example, a metal gate electrode layer is formed to wrap around both the hybrid fin structure (e.g., the ferroelectric structure) and the semiconductor fin structure. The metal gate electrode layer therefore electrically couples the ferroelectric fin structure and the semiconductor fin structure together. A conductive structure may be formed on the ferroelectric structure to serve as the gate terminal of the transistor of the negative capacitance device. In some other embodiments, the ferroelectric structure is implemented as a ferroelectric layer that is disposed laterally adjacent to, but still physically separated from, a gate stack of a planar transistor. Conductive electrode layers may be formed above and below the ferroelectric layer. One of these conductive electrodes is electrically coupled to the gate stack of the planar transistor through a connection mechanism (e.g., metal lines or vias) of a multilayer interconnect structure, while the other one of these conductive electrodes has a conductive structure formed thereon to serve as the gate terminal of the planar transistor.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is more flexibility with respect to capacitance matching. As discussed above, conventional negative capacitance devices implement the ferroelectric layer as a layer internally within the gate stack, for example as a layer sandwiched between the channel and the gate electrode. This scheme places severe restrictions on the size and/or location of the ferroelectric layer, which limits negative capacitance tuning freedom. In contrast, the external implementation of the ferroelectric layer herein allows much greater flexibility in terms of configuring the size and/or location of the ferroelectric layer. Consequently, the present disclosure offers improved negative capacitance tuning flexibility. Furthermore, the larger size of the external ferroelectric structure discussed herein may be used to provide a performance boost. Other advantages include compatibility with existing fabrication processes and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

The present disclosure provides a semiconductor device. The semiconductor device includes a substrate. A first fin structure is disposed over the substrate. The first fin structure contains a semiconductor material. A gate dielectric layer is disposed over upper and side surfaces of the first fin structure. A gate electrode layer is formed over the gate dielectric layer. A second fin structure is disposed over the substrate. The second fin structure is physically separated from the first fin structure and contains a ferroelectric material. The second fin structure is electrically coupled to the gate electrode layer.

The present disclosure provides a semiconductor device. The semiconductor device includes a channel region formed in a substrate. A gate stack includes a gate dielectric disposed over the channel region and a gate electrode disposed over the gate dielectric. An isolation structure is disposed externally to the gate stack. A ferroelectric layer is disposed over the isolation structure. The ferroelectric layer is electrically coupled to the gate stack.

The present disclosure provides a method of fabricating a semiconductor device. A dielectric layer is formed over a semiconductor fin structure. The semiconductor fin structure protrudes upward out of a substrate. The dielectric mask layer is etched to form a trench. A hybrid fin structure is formed in the trench by depositing a ferroelectric material in the trench. A gate dielectric layer is formed over at least the semiconductor fin structure. A gate electrode layer is formed over the semiconductor fin structure and the hybrid fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a dielectric layer over a semiconductor fin structure, wherein the semiconductor fin structure protrudes upward out of a substrate;
    etching the dielectric layer to form a trench;
    forming a hybrid fin structure in the trench by depositing a ferroelectric material in the trench;
    forming a gate dielectric layer over at least the semiconductor fin structure; and
    forming a gate electrode layer over the semiconductor fin structure and the hybrid fin structure.

2. The method of claim 1, further comprising: forming an interfacial dielectric layer over the semiconductor fin structure but not over the hybrid fin structure.

3. The method of claim 2, wherein the forming of the gate dielectric layer comprises depositing a high-k dielectric material over the interfacial dielectric layer and over the hybrid fin structure.

4. The method of claim 1, wherein the forming of the gate electrode layer comprises forming a metal gate electrode layer that wraps around both the semiconductor fin structure and the hybrid fin structure.

5. The method of claim 1, further comprising: electrically coupling the ferroelectric material with a conductive structure.

6. The method of claim 1, wherein the ferroelectric material contains hafnium oxide, hafnium zirconium oxide, hafnium aluminum oxide, lead zirconium titanium oxide, barium titanium oxide, or combinations thereof.

7. The method of claim 1, further comprising:
forming an opening that vertically extends through the hybrid fin structure; and
filling the opening with an electrically insulating material.

8. The method of claim 1, wherein in a top view:
the hybrid fin structure and the semiconductor fin structure each extends in a first direction; and
the hybrid fin structure and the semiconductor fin structure are spaced apart from each other in a second direction different from the first direction.

9. The method of claim 1, wherein an upper corner of the semiconductor fin structure or an upper corner of the hybrid fin structure is rounded.

10. The method of claim 1, wherein the hybrid fin structure and the semiconductor fin structure have substantially similar heights.

11. The method of claim 1, further comprising: forming liners on side surfaces of the semiconductor fin structure, but not on side surfaces of the hybrid fin structure.

12. A method of fabricating a semiconductor device, comprising:
forming a first fin structure that protrudes vertically upward from a substrate;
after the first fin structure is formed, forming a second fin structure that protrudes vertically upward from the substrate, wherein the second fin structure is spaced apart from the first fin structure, wherein the first fin structure and the second fin structure have different material compositions, and wherein one of the first fin structure and the second fin structure has a non-semiconductor material composition;
performing one or more etching processes, wherein upper corners of the first fin structure and the second fin structure are rounded by the one or more etching processes;
forming, after the performing of the one or more etching processes, a dummy gate structure over the first fin structure and the second fin structure; and
replacing the dummy gate structure with a metal-containing gate structure.

13. The method of claim 12, wherein:
the first fin structure is formed to have a semiconductor material composition; and
the second fin structure is formed to have a ferroelectric material composition.

14. The method of claim 13, further comprising: forming an interfacial layer over the first fin structure but not, over the second fin structure.

15. The method of claim 12, further comprising: forming a conductive contact over an upper surface of the second fin structure.

16. The method of claim 12, further comprising, before the forming of the dummy gate structure:
etching a trench that extends vertically through the second fin structure; and
filling the trench with an electrically insulative material.

17. A method of fabricating a semiconductor device, comprising:
forming a mask layer over a semiconductor fin structure that protrudes vertically from a substrate;
etching a recess into the mask layer;
depositing a ferroelectric material in the recess;
forming a trench that vertically extends through the ferroelectric material;
filling the trench with an electrically isolating material; and
forming a metal-containing gate structure over the semiconductor fin structure and over the ferroelectric material, wherein the forming the metal-containing gate structure comprises forming an interfacial layer over the semiconductor fin structure but not over the ferroelectric material.

18. The method of claim 17, further comprising: forming a conductive contact over an upper surface of the ferroelectric material.

19. The method of claim 17, further comprising: before the forming the mask layer, forming a liner layer on side surface of the semiconductor fin structure and over the substrate, wherein the mask layer is formed over the liner layer.

20. The method of claim 17, further comprising: before the forming of the metal-containing gate structure, performing one or more etching processes that expose portions of the semiconductor fin structure and the ferroelectric material, wherein upper corners of the semiconductor fin structure and the ferroelectric material are rounded by the one or more etching processes.

* * * * *